United States Patent
Hung et al.

(10) Patent No.: US 7,504,184 B2
(45) Date of Patent: *Mar. 17, 2009

(54) PHASE-SHIFTING MASK FOR EQUAL LINE/SPACE DENSE LINE PATTERNS

(75) Inventors: Yung-Long Hung, Taipei Hsien (TW); Yuan-Hsun Wu, Tao-Yuan Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 703 days.

This patent is subject to a terminal disclaimer.

(21) Appl. No.: 11/160,512

(22) Filed: Jun. 27, 2005

(65) Prior Publication Data
US 2006/0240333 A1 Oct. 26, 2006

(30) Foreign Application Priority Data
Apr. 20, 2005 (TW) .............................. 94112595 A (51) Int. Cl.
*G03F 1/00* (2006.01)
(52) U.S. Cl. ......................................................... 430/5
(58) Field of Classification Search ....................... 430/5
See application file for complete search history.

(56) References Cited

U.S. PATENT DOCUMENTS 5,281,500 A * 1/1994 Cathey et al. .................. 430/5
6,013,396 A * 1/2000 Capodieci ...................... 430/5
6,428,938 B1 * 8/2002 Lin et al. ........................ 430/5
2006/0240332 A1 * 10/2006 Hung et al. ..................... 430/5
2007/0054201 A1 * 3/2007 Hung et al. ..................... 430/5

FOREIGN PATENT DOCUMENTS

| TW | 508682 | 11/2002 |
| TW | 554236 | 9/2003 |
| TW | 573309 | 1/2004 |

* cited by examiner

*Primary Examiner*—Mark F Huff
*Assistant Examiner*—Stewart A Fraser
(74) *Attorney, Agent, or Firm*—Winston Hsu (57) ABSTRACT

A phase-shifting mask suited for equal line/space, small pitched, dense line pattern is disclosed. The phase-shifting mask includes a transparent substrate, a partially shielded mesa line pattern of first phase formed on the substrate, and a 100% clear recessed line pattern of second phase etched into the substrate and is disposed right next to the partially shielded mesa line pattern. The partially shielded mesa line pattern has a plurality of alternating 45-degree, oblique areas and 100% transmittance clear regions of the first phase. The partially shielded mesa line pattern and the clear recessed line pattern have the same line width. The light that passes through the clear regions of the first phase and the light that passes through the clear recessed line pattern of second phase have a phase difference of 180 degree.

7 Claims, 13 Drawing Sheets

PHASE-SHIFTING MASK FOR EQUAL LINE/SPACE DENSE LINE PATTERNS

BACKGROUND OF INVENTION

1. Field of the Invention

The present invention relates to a phase-shifting mask (PSM), and more particularly, to a PSM that is capable of generating equal line/space dense line patterns with enhanced critical dimension (CD) uniformity, and lithographic method thereof.

2. Description of the Prior Art

Lithography processing, which is an essential technology when manufacturing integrated circuits, is used for defining geometries, features, lines, or shapes onto a die or wafer. In the fabrication of integrated circuits, lithography plays an important role in limiting feature size. By using lithography, a circuit pattern can be precisely transferred onto a die or wafer. Typically, to implement the lithography, a designed pattern such as a circuit layout pattern or an ion doping layout pattern in accordance with a predetermined design rule is created on one or several mask in advance. The pattern on the mask is then transferred by light exposure, with a stepper and scanner, onto the wafer.

It is critical in this field to solve resolution of the lithographic process as the device sizes of the semiconductor industry continue to shrink to the deep sub-micron scale. There are primarily two methods in the prior art for improving resolution. One method involves using short wavelengths of light to expose a photoresist layer on the semiconductor wafer. Short wavelengths of light are desirable as the shorter the wavelength, the higher the possible resolution of the pattern. Another method involves the use of a phase-shifting mask (PSM) to improve the resolution of the pattern transferred to the semiconductor wafer.

Figure 1:
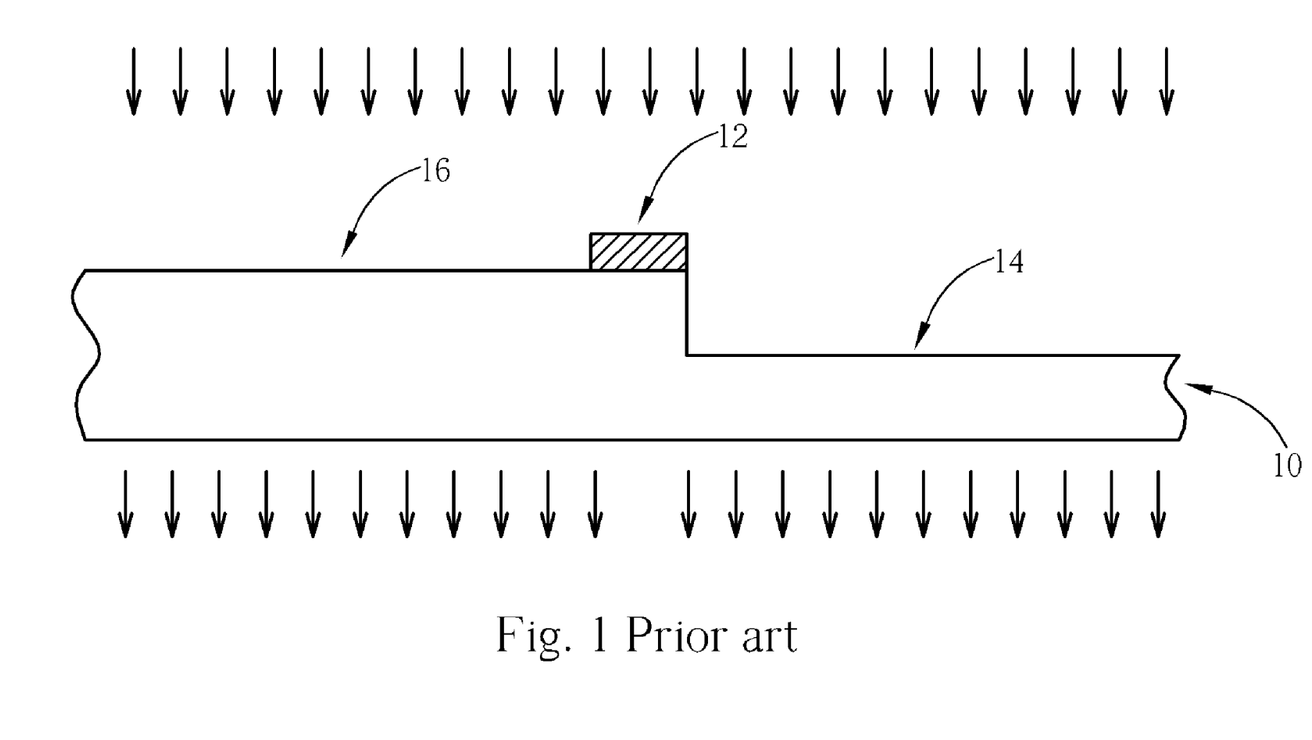
FIG. 1 is a structural diagram of a prior art alternating phase mask.

Please refer to FIG. 1, which is a structural diagram of a prior art alternating phase-shifting mask 10. As shown in FIG. 1, a fully opaque material such as chrome is used in a non-transparent region 12 of the alternating phase-shifting mask 10, and the non-transparent region 12 is flanked with transparent regions 14 and 16. Both of the transparent regions 14 and 16 are made of quartz. The thickness of the transparent region 14 is less than that of the transparent region 16. Therefore, light that passes through the transparent region 14 has a 180-degree phase shift relative to light that passes through the thicker transparent region 16, which results in destructive interference and image contrast. Consequently, during the lithographic process, a dark unexposed region falls on an area of a photoresist layer and is located below the non-transparent region 12 of the alternating phase-shifting mask 10.

However, the alternating phase-shifting mask (alt-PSM) 10 has to perform a double-exposure/two-mask lithography process involving a trim mask to complete pattern transferring. The first mask is a phase-shifting mask and the second mask is a single-phase trim mask. The phase-shifting mask primarily defines regions requiring phase shifting. The single-phase trim mask primarily defines regions not requiring phase shifting. However, this optical proximity correction (OPC) technique suffers from transmission imbalance occurred in phase shifted and non-phase-shifted regions and other flaws caused by alt-PSM.

Figure 2:
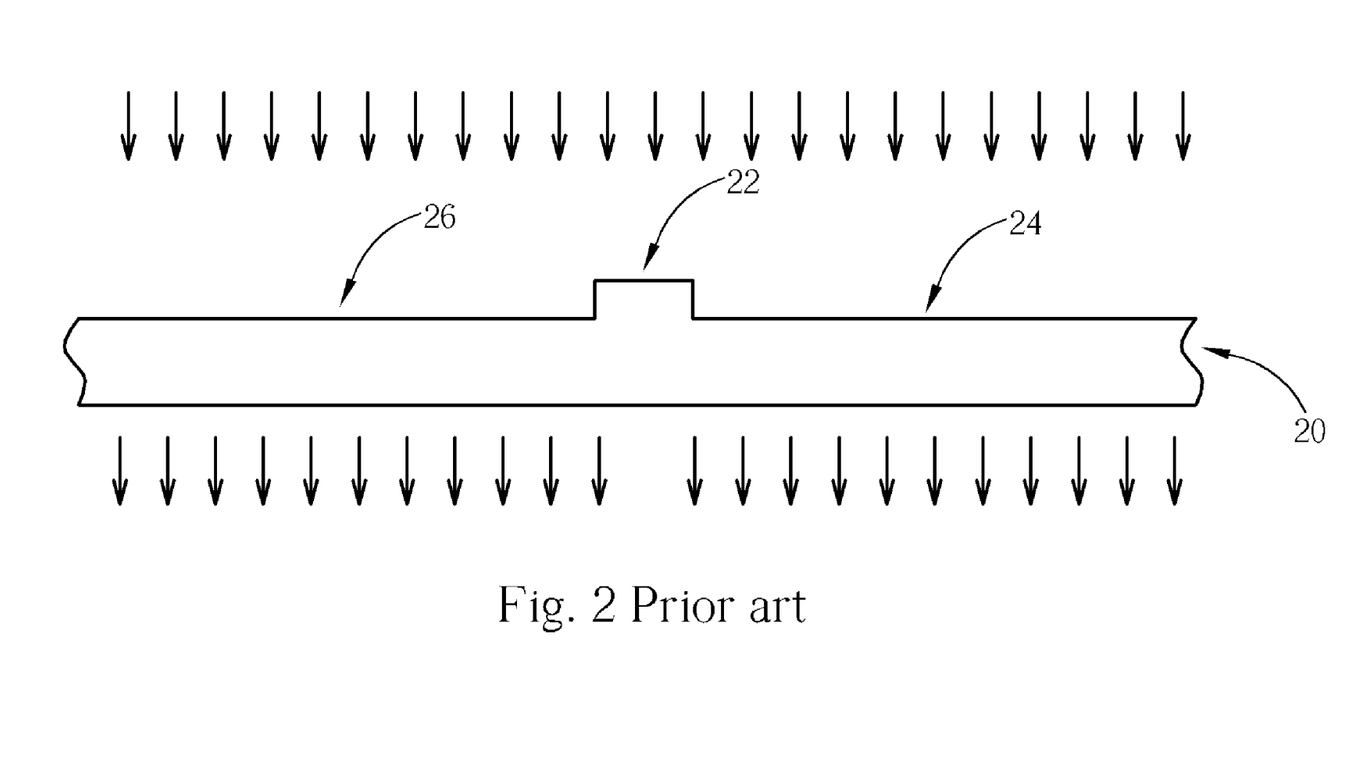
FIG. 2 is a structural diagram of a prior art chromeless phase-shifting mask.

Therefore, a chromeless phase-shifting mask is developed. Please refer to FIG. 2, which is a structural diagram of a prior art chromeless phase-shifting mask 20. As shown in FIG. 2, the chromeless phase-shifting mask comprises a transparent region 22 made of quartz, and the transparent region 22 is flanked with the transparent quartz regions 24 and 26. The transparent region 22 is thicker than both the transparent regions 24, 26, which causes a 180 degree phase-shifting in light passing through the transparent regions 24, 26.

In other words, the transparent regions 24, 26 are phase-shifting regions, and the transparent region 22 is a non-phase-shifting region. Because of this 180-degree phase difference, there is destructive interference at the phase boundaries of the phase-shifting regions 24, 26 and the non-phase-shifting region 22. Consequently, during the lithographic process, a dark unexposed region falls on an area of a photoresist layer and is located below the non-phase-shifting region 22 of the chromeless phase-shifting mask 20.

Figure 3:
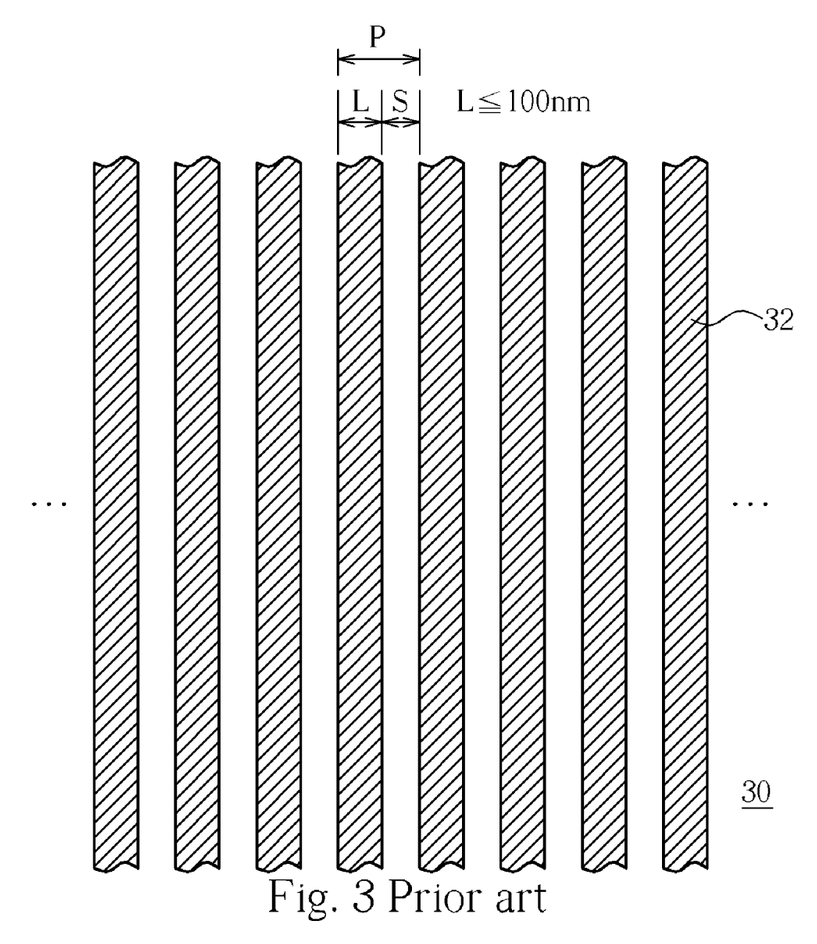
FIG. 3 is a plan view of a portion of word lines overlying a semiconductor wafer.

However, with the increase of packing density of devices such as dynamic random access memory (DRAM) devices, a pitch between adjacent micro features of the device such as word line pitch shrinks dramatically. Please refer to FIG. 3. FIG. 3 is a plan view of a portion of word lines 32 overlying a semiconductor wafer 30. As shown in FIG. 3, pitch P of the word lines 32 is equal to the combination of line width L and the spacing S between two adjacent word lines 32 (P=L+S). When the line width L is less than or equal to 100 nm, and the pitch P is substantially equal to the twice of the line width L of the device and forms a dense pattern, light of 0 degree phase shift and light of 180 degrees phase-shifting cancel out. Therefore, the prior art chromeless phase-shifting mask fails to transfer the dense pattern.

SUMMARY OF INVENTION

It is therefore an object of the claimed invention to provide a phase-shifting mask for solving the above-mentioned problems.

According to the claimed invention, a phase-shifting mask (PSM) is provided. The PSM includes a transparent substrate; columns of first phase-shifting line patterns having a first substrate thickness of first phase disposed on the transparent substrate along a first direction, wherein each of the first phase-shifting line patterns is alternately disposed thereon with 100% clear regions of the first phase and 45-degree, oblique opaque areas; and columns of 100% light transmittable second phase-shifting line patterns, in parallel with the first phase-shifting line patterns, having a second substrate thickness of second phase, wherein the first phase-shifting line patterns and second phase-shifting line patterns have the same line width and are alternately disposed on the transparent substrate.

In one aspect of this invention, a phase-shifting mask suited for equal line/space, small pitched, dense line pattern is disclosed. The phase-shifting mask includes a transparent substrate, a partially shielded mesa line pattern of first phase formed on the substrate, and a 100% clear recessed line pattern of second phase etched into the substrate and is disposed right next to the partially shielded mesa line pattern. The partially shielded mesa line pattern has a plurality of alternating 45-degree, oblique areas and 100% transmittance clear regions of the first phase. The partially shielded mesa line pattern and the clear recessed line pattern have the same line width. The light that passes through the clear regions of the first phase and the light that passes through the clear recessed line pattern of second phase have a phase difference of 180 degree.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In describing the preferred embodiment of the present invention, reference will be made herein to FIGS. 4-13 of the drawings, wherein like numerals designate like components, areas or regions. Features of the invention are not drawn to scale in the drawings.

The present invention pertains to an improved phase-shifting mask (PSM), which is capable of solving equal line/space, small pitched, dense line patterns such as word lines or gate conductors of trench-capacitor dynamic random access memory (DRAM) devices having critical line width that is less than or equal to 100 nanometers. The critical dimension (CD) uniformity of the resultant equal line/space dense line pattern transferred from the PSM of this invention to a photoresist film coated on a wafer is also enhanced.

Figure 4:
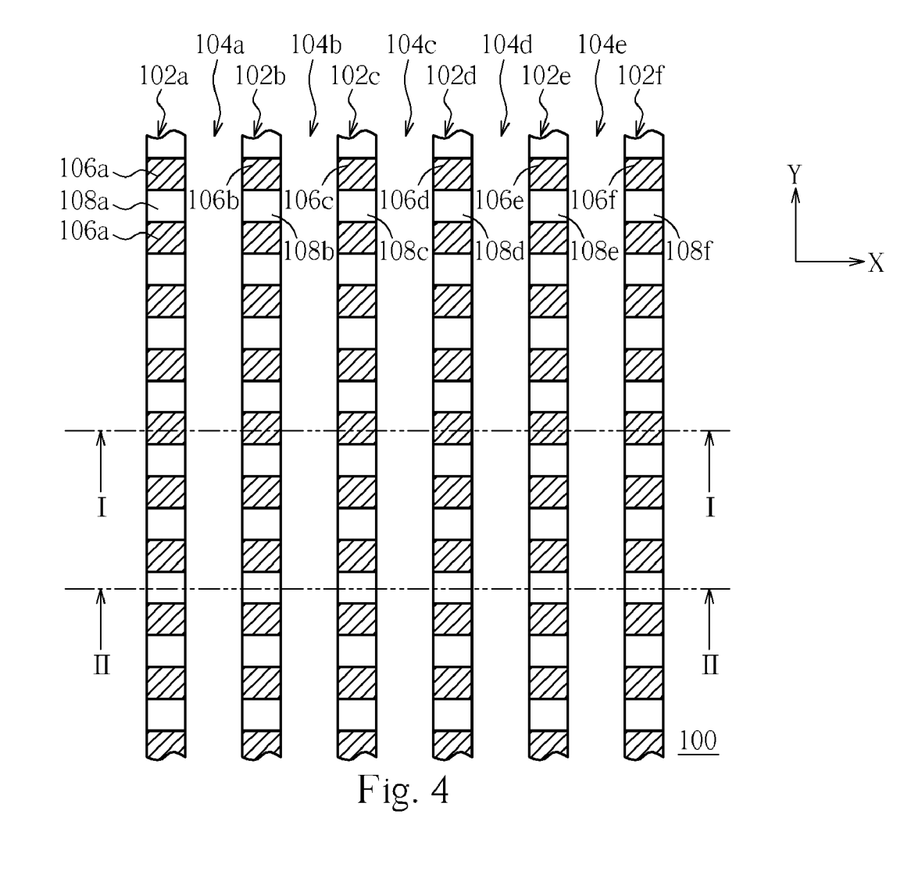
FIG. 4 is a plan view of a portion of the layout of a PSM in accordance with one preferred embodiment of this invention.
Figure 5:
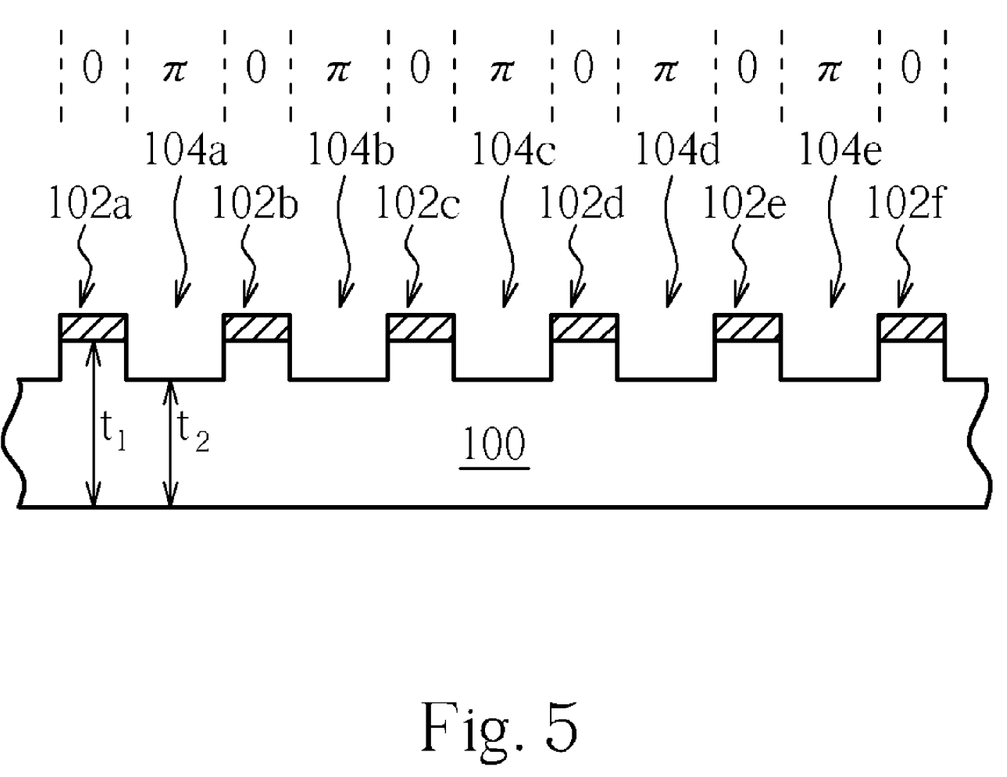
FIG. 5 is a schematic, cross-sectional view of the PSM taken along line I-I of FIG. 4.
Figure 6:
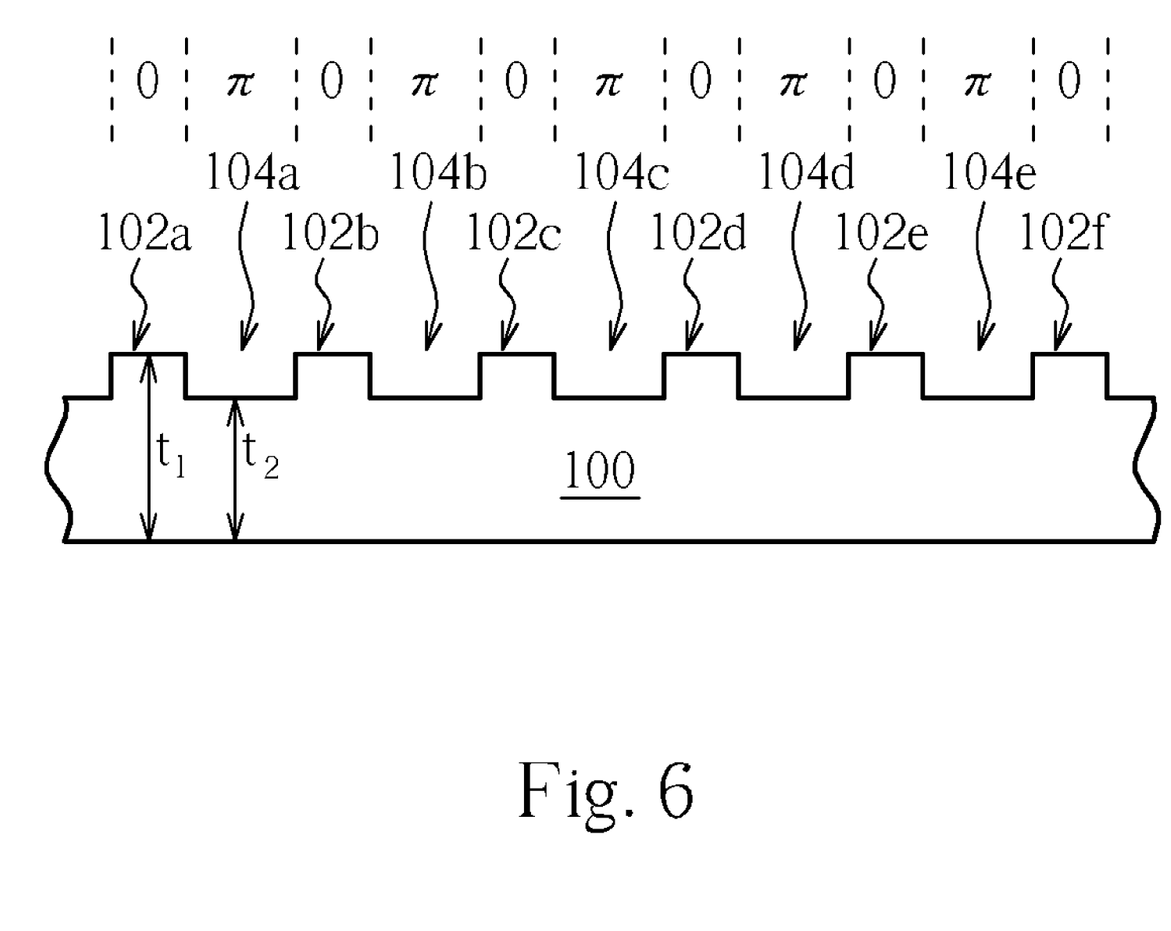
FIG. 6 is a schematic, cross-sectional view of the PSM taken along line II-II of FIG. 4.
Figure 7:
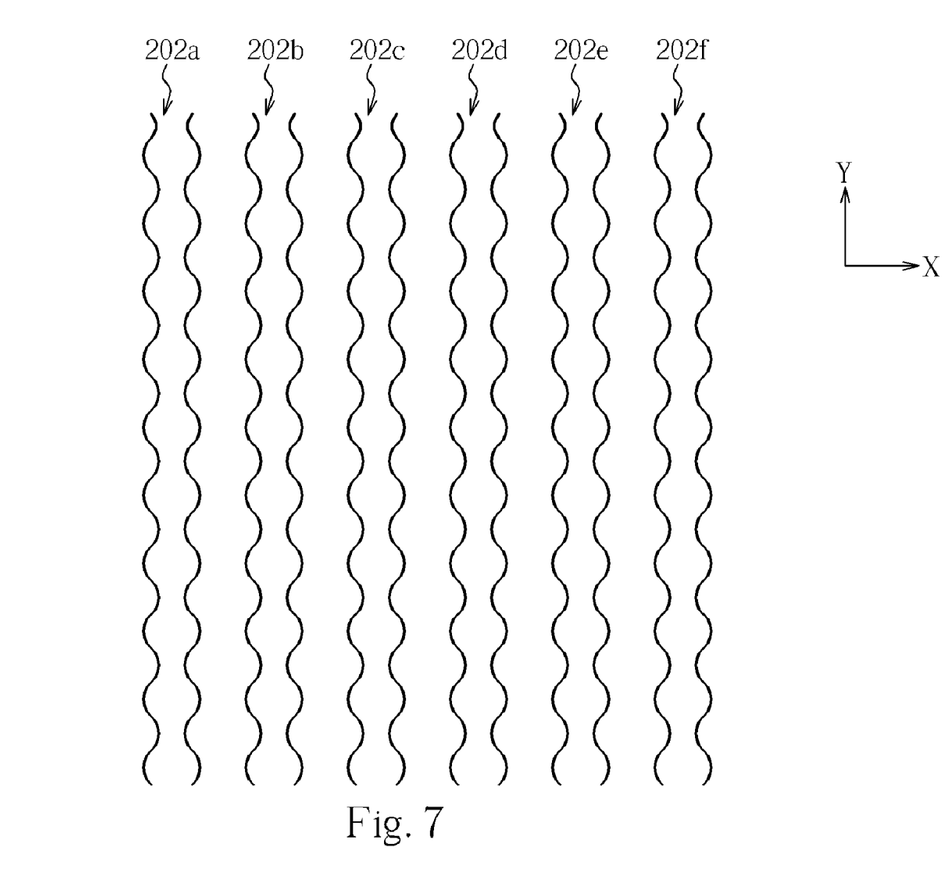
FIG. 7 is a plan view of a portion of the resultant equal line/space dense line pattern transferred from the PSM of this invention to a photoresist film coated on a wafer.

Please refer to FIGS. 4-7, wherein FIG. 4 is a plan view of a portion of the layout of a PSM in accordance with one preferred embodiment of this invention; FIG. 5 is a schematic, cross-sectional view of the PSM taken along line I-I of FIG. 4; FIG. 6 is a schematic, cross-sectional view of the PSM taken along line II-II of FIG. 4; FIG. 7 is a plan view of a portion of the resultant equal line/space dense line pattern transferred from the PSM of this invention to a photoresist film coated on a wafer.

As shown in FIG. 4, the PSM in accordance with one preferred embodiment of this invention comprises a transparent quartz substrate 100, a plurality of first phase-shifting line patterns 102a-102f arranged in parallel with each other along the reference Y-axis, and a plurality of second phase-shifting line patterns 104a-104e arranged in parallel with each other along the reference Y-axis. According to the preferred embodiment, the line width of each of the first phase-shifting line patterns 102a-102f and the line width of each of the second phase-shifting line patterns 104a-104e are the same.

The first phase-shifting line patterns 102a-102f and second phase-shifting line patterns 104a-104e are alternately formed on the quartz substrate 100. By way of example, the second phase-shifting line pattern 104a is disposed between the first phase-shifting line pattern 102a and the first phase-shifting line pattern 102b, the second phase-shifting line pattern 104b is disposed between the first phase-shifting line pattern 102b and the first phase-shifting line pattern 102c, and so forth. Besides, on each of the first phase-shifting line patterns 102a-102f, a plurality of opaque chrome areas 106a-106f are provided. These opaque chrome areas are disposed equally spaced apart from each other on each of first phase-shifting line patterns 102a-102f. As shown in FIG. 4, for example, a 100%-light transmission first phase-shifting area 108a is disposed between two adjacent opaque chrome areas 106a along the first phase-shifting line pattern 102a. The opaque chrome areas 106a-106f, which are equal in size, completely block the passage of light from passing therethrough.

Therefore, the second phase-shifting line patterns 104a-104e of the PSM of this invention are 100% light transmittable. Each of the first phase-shifting line patterns 102a-102f of the PSM encompasses alternating 100% light transmittable clear areas and opaque chrome areas. The phase-shifting mask of this invention is partially shielded along the mesa line pattern 102a-102f of first phase. According to the first preferred embodiment, the length of one side of each of the rectangular opaque chrome areas 106a-106f along the reference Y-axis ranges approximately from $\lambda/4$ to $3\lambda/4$ ($\lambda$: wavelength of the exposure light source of the stepper and scanner, in nanometer). The length of one side of each of the rectangular 100% light transmittable clear areas 108a-108f along the reference Y-axis ranges approximately from $\lambda/4$ to $3\lambda/4$.

As shown in FIG. 5 and FIG. 6, the thickness of the quartz substrate 100 underneath each of the first phase-shifting line patterns 102a-102f is denoted as $t_1$, and the thickness of the quartz substrate 100 underneath each of the second phase-shifting line patterns (also referred to as "clear recessed line patterns") 104a-104e is denoted as $t_2$, wherein $t_1$ is greater than $t_2$ ($t_1 > t_2$), such that light passing through the quartz substrate 100 having such thickness difference produces image contrast. The phase difference between the phase of light that passes through the first phase-shifting line patterns 102a-102f and the phase of light that passes through the second phase-shifting line patterns 104a-104e is 180-degree. Preferably, the phase of light that passes through the first phase-shifting line patterns 102a-102f is 0-degree, while the phase of light that passes through the second phase-shifting line patterns 104a-104e is 180-degree ($\pi$).

According to the first preferred embodiment, the plurality of spaced apart opaque chrome areas 106a-106f, which are disposed on each of the first phase-shifting line patterns 102a-102f, are aligned with the reference X-axis. By providing such unique layout, dense line patterns 202a-202f of equal line/space can be transferred from the PSM of this invention to a photoresist film coated on a wafer, which is depicted in FIG. 7.

Figure 8:
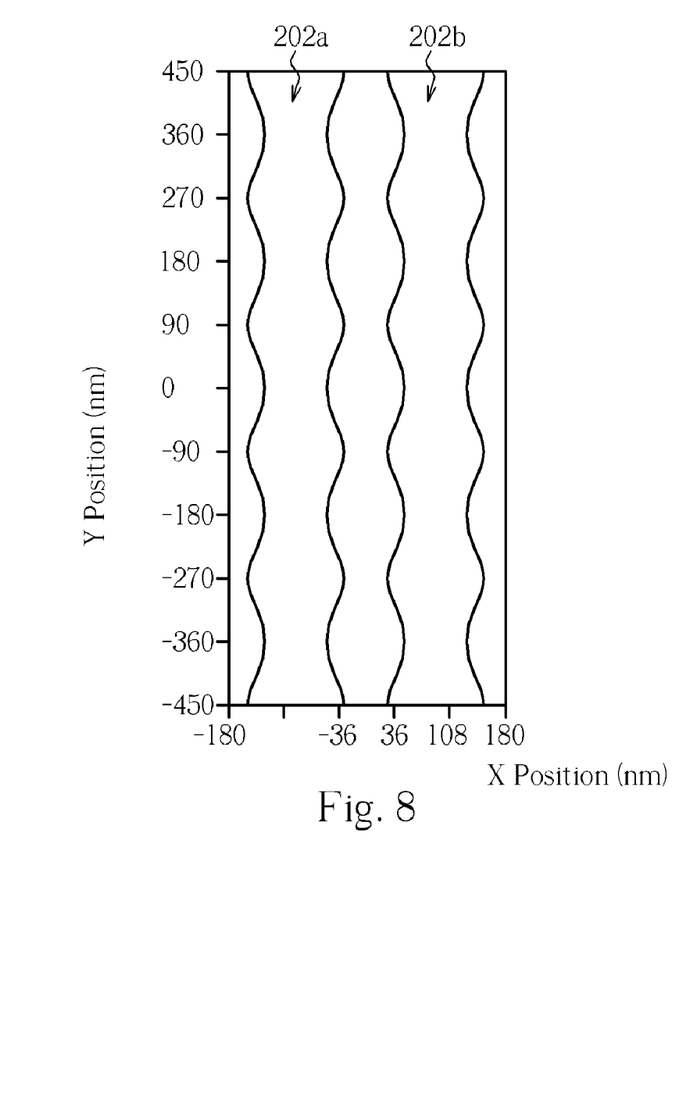
FIG. 8 is a schematic diagram illustrating the CD uniformity of the equal line/space dense line patterns 202a and 202b of FIG. 7 according to the first preferred embodiment of this invention.

However, the critical dimension (CD) uniformity of the resultant dense line pattern (in equal line/space fashion) is still not satisfactory. FIG. 8 is a schematic diagram illustrating the CD uniformity of the equal line/space dense line patterns 202a and 202b of FIG. 7 according to the first preferred embodiment of this invention. As can be seen in this figure, the variation of the CD of the line pattern 202a or 202b is high, and leads to wavelike line profiles.

Figure 9:
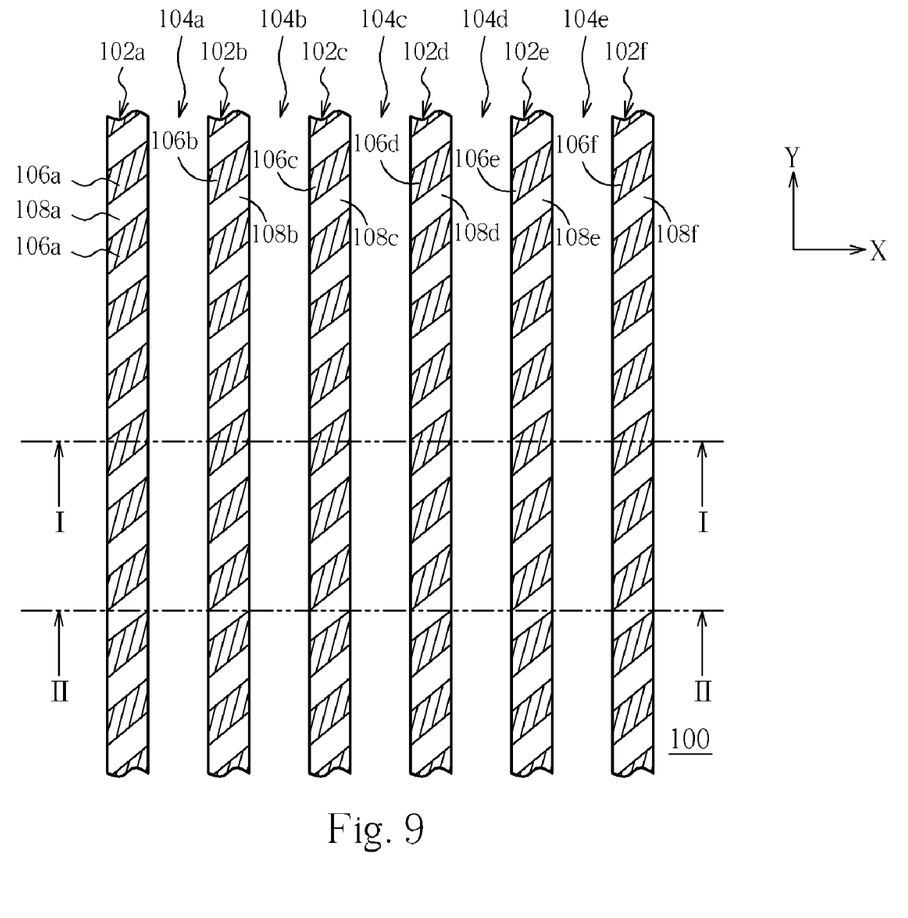
FIG. 9 is a plan view of a portion of the layout of a PSM in accordance with second preferred embodiment of this invention.
Figure 10:
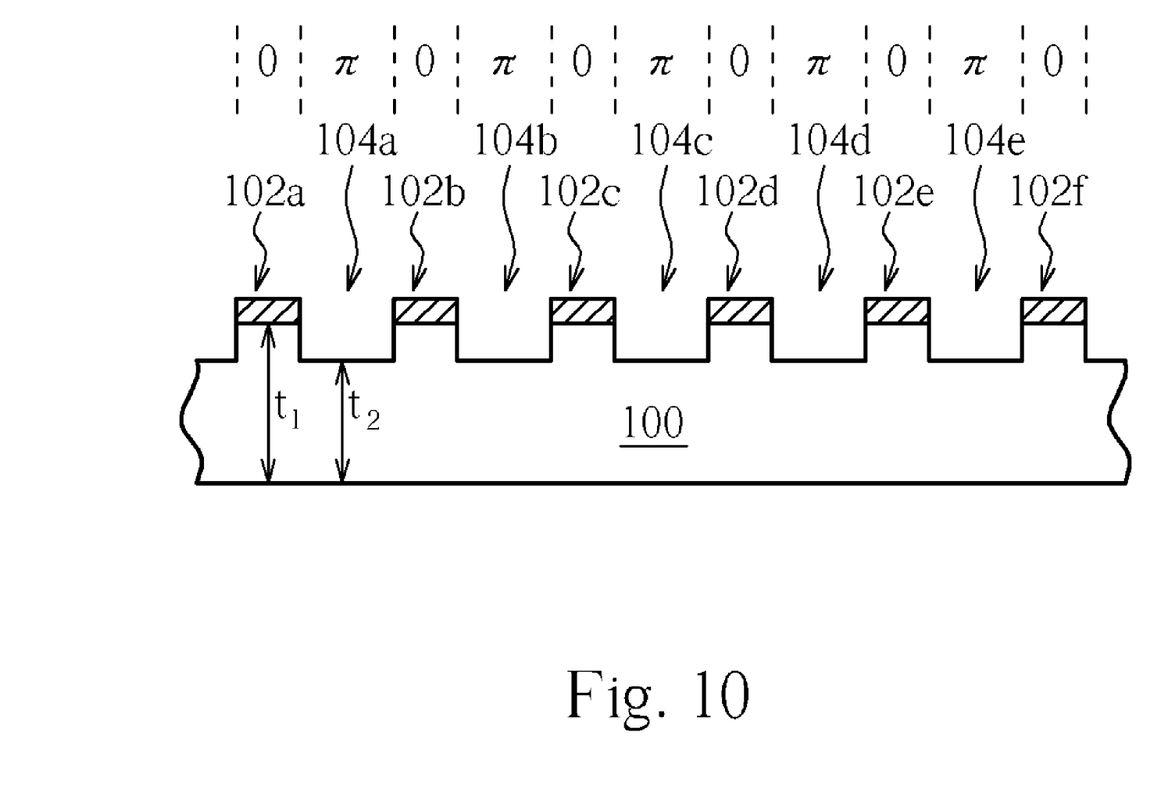
FIG. 10 is a schematic, cross-sectional view of the PSM taken along line I-I of FIG. 9.
Figure 11:
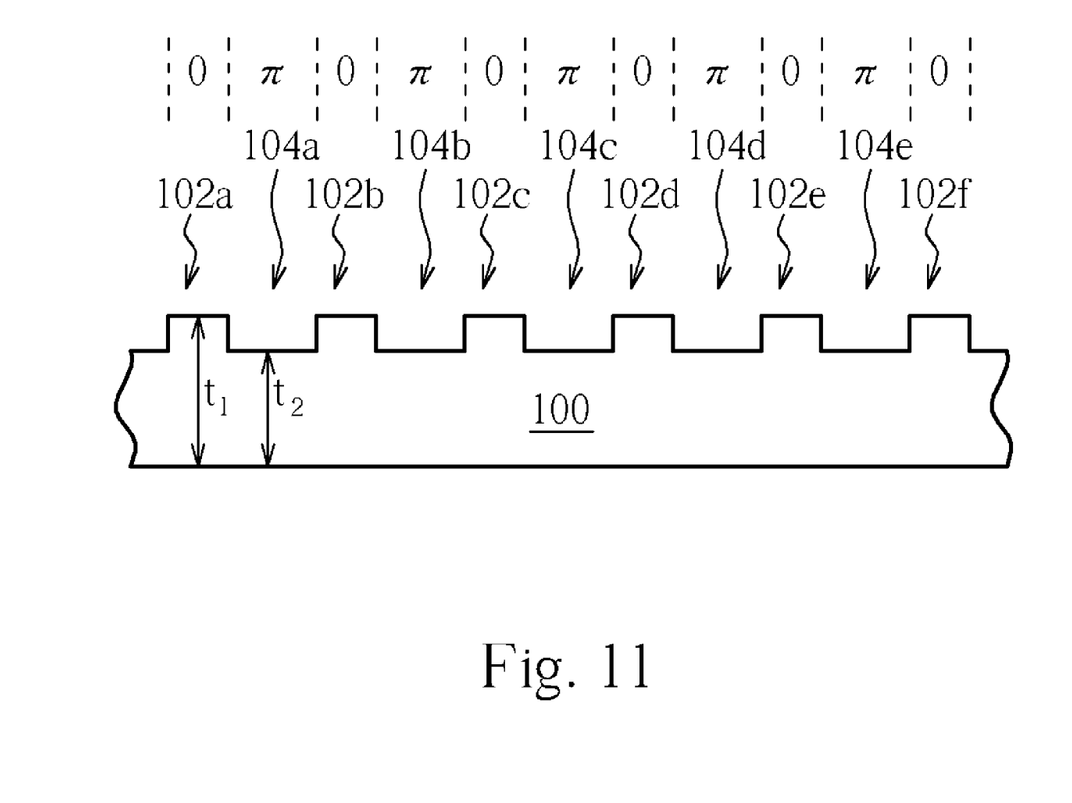
FIG. 11 is a schematic, cross-sectional view of the PSM taken along line II-II of FIG. 9.
Figure 12:
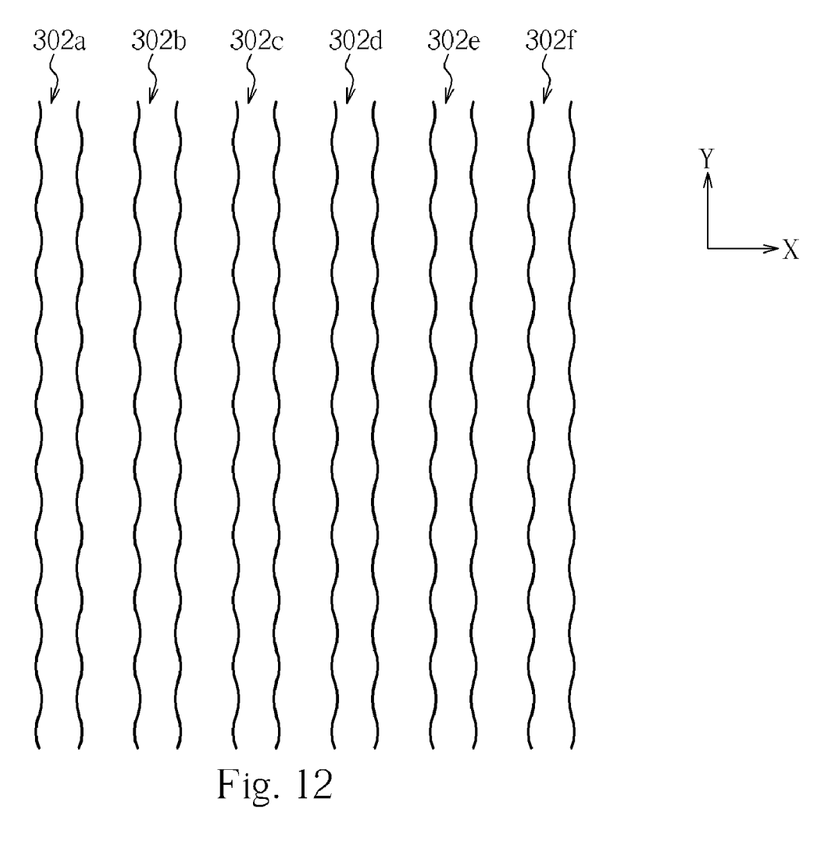
FIG. 12 is a plan view of a portion of the resultant equal line/space dense line pattern transferred from the PSM of FIG. 9 to a photoresist film in accordance with the second embodiment of this invention.

Please refer to FIGS. 9-12, wherein FIG. 9 is a plan view of a portion of the layout of a PSM in accordance with second preferred embodiment of this invention; FIG. 10 is a schematic, cross-sectional view of the PSM taken along line I-I of FIG. 9; FIG. 11 is a schematic, cross-sectional view of the PSM taken along line II-II of FIG. 9; FIG. 12 is a plan view of a portion of the resultant equal line/space dense line pattern transferred from the PSM of FIG. 9 to a photoresist film in accordance with the second embodiment of this invention.

As shown in FIG. 9, the PSM in accordance with the second preferred embodiment of this invention comprises a transparent quartz substrate 100, a plurality of first phase-shifting line patterns 102a-102f arranged in parallel with each other along the reference Y-axis, and a plurality of second phase-shifting line patterns 104a-104e arranged in parallel with each other along the reference Y-axis. According to the second preferred embodiment, the line width of each of the first phase-shifting line patterns 102a-102f and the line width of each of the second phase-shifting line patterns 104a-104e are the same.

Likewise, the first phase-shifting line patterns 102a-102f and second phase-shifting line patterns 104a-104e are alternately formed on the quartz substrate 100. By way of example, the second phase-shifting line pattern 104a is disposed between the first phase-shifting line pattern 102a and the first phase-shifting line pattern 102b, the second phase-shifting line pattern 104b is disposed between the first phase-shifting line pattern 102b and the first phase-shifting line pattern 102c, and so forth. According to the second preferred embodiment, along each of the first phase-shifting line patterns 102a-102f, a plurality of 45-degree, oblique chrome areas 106a-106f are provided. The oblique chrome areas are disposed equally spaced apart from each other along each of first phase-shifting line patterns 102a-102f. As shown in FIG. 9, for example, a 100%-light transmission first phase-shifting area 108a is disposed between two adjacent oblique chrome areas 106a along the first phase-shifting line pattern 102a. These oblique chrome areas are equal in size. To form the oblique chrome areas 106a-106f, the direction of the e-beam second writing is rotated with respect to the direction of first writing by 45 degree in the fabrication of such photomask.

Therefore, the second phase-shifting line patterns 104a-104e of the PSM of this invention are 100% light transmittable. Each of the first phase-shifting line patterns 102a-102f of the PSM encompasses alternating clear areas and oblique chrome areas. According to the second preferred embodiment, the length of one side of each of the 45-degree, oblique chrome areas 106a-106f along the reference Y-axis ranges approximately from $\lambda/4$ to $3\lambda/4$ ($\lambda$: wavelength of the exposure light source of the stepper and scanner in nanometer). The length of one side of each of the 100% light transmittable clear areas 108a-108f along the reference Y-axis ranges approximately from $\lambda/4$ to $3\lambda/4$.

As shown in FIG. 10 and FIG. 11, the thickness of the quartz substrate 100 underneath each of the first phase-shifting line patterns 102a-102f is denoted as $t_1$, and the thickness of the quartz substrate 100 underneath each of the second phase-shifting line patterns 104a-104e is denoted as $t_2$, wherein $t_1$ is greater than $t_2$ ($t_1 > t_2$), such that light passing through the quartz substrate 100 having thickness difference produces image contrast. The phase difference between the phase of light that passes through the first phase-shifting line patterns 102a-102f and the phase of light that passes through the second phase-shifting line patterns 104a-104e is 180-degree. Preferably, the phase of light that passes through the first phase-shifting line patterns 102a-102f is 0-degree, while the phase of light that passes through the second phase-shifting line patterns 104a-104e is 180-degree ($\pi$).

Figure 13:
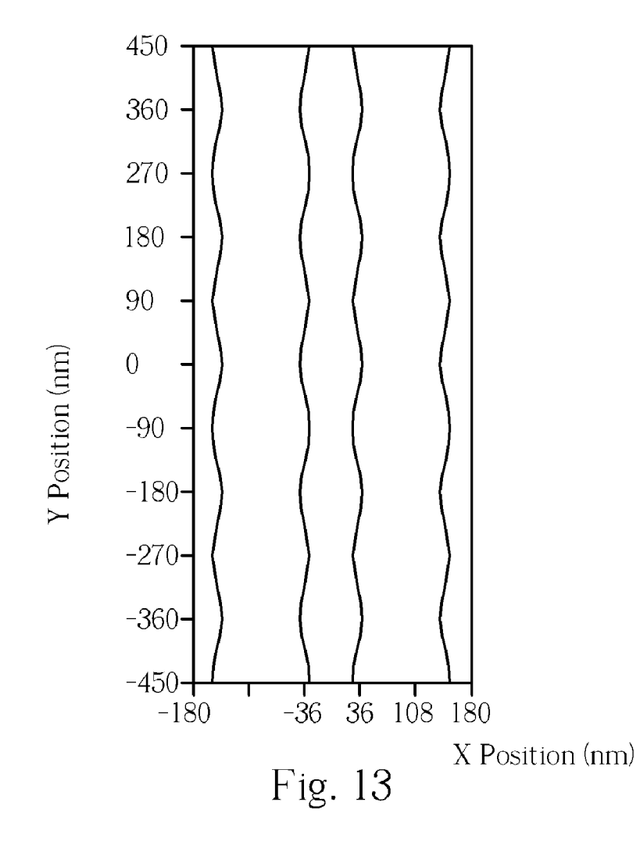
FIG. 13 is a schematic diagram illustrating the CD uniformity of the equal line/space dense line patterns 202a and 202b of FIG. 12 according to the second preferred embodiment of this invention.

By providing such improved layout of the PSM, resultant dense line patterns 302a-302f transferred from the PSM of this invention to a photoresist film coated on a wafer is depicted in FIG. 12. The CD uniformity of the resultant dense line pattern of equal line/space is enhanced. FIG. 13 is a schematic diagram illustrating the CD uniformity of the equal line/space dense line patterns 302a and 302b of FIG. 12 according to the second preferred embodiment of this invention. As can be seen in this figure, the variation of the CD of the line pattern 302a or 302b is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-shifting mask (PSM), comprising:
   a transparent substrate;
   a first phase-shifting line pattern having multiple columns, each column having clear regions and opaque areas intermittently and alternately disposed with respect to one another on the transparent substrate; and
   a second phase-shifting line pattern having multiple columns, in parallel relative to the first phase-shifting line pattern, wherein each clear region and opaque area are positioned 45 degree with respect to the second phase-shifting line pattern.

2. The PSM of claim 1 wherein the opaque areas are substantially equal in size.

3. The PSM of claim 1 wherein the opaque areas are disposed equally spaced apart along each column of the first phase-shifting line pattern.

4. The PSM of claim 1 wherein each of the opaque areas has a length along a first direction ranging from $\lambda/4$ to $3\lambda/4$ ($\lambda$: wavelength of exposure light source of a stepper and scanner).

5. The PSM of claim 4 wherein each of the clear regions of the first phase-shifting line pattern has a length along the first direction ranging from $\lambda/4$ to $3\lambda/4$ ($\lambda$: wavelength of exposure light source of a stepper and scanner).

6. The PSM of claim 1 wherein light that passes through the clear regions and light that passes through the second phase-shifting line pattern have a phase difference of 180 degree.

7. The PSM of claim 1 wherein the transparent substrate is a quartz substrate.

* * * * *